United States Patent [19]

Hennessey et al.

[11] E Re. 28,799

[45] Reissued May 4, 1976

[54] MOUNTING BRACKET FOR DISPLAY PANEL

[75] Inventors: William M. Hennessey, Somerville; Hector R. Schorno, Rockaway, both of N.J.

[73] Assignee: Burroughs Corporation, Detroit, Mich.

[22] Filed: July 12, 1974

[21] Appl. No.: 487,932

Related U.S. Patent Documents

Reissue of:

[64] Patent No.: 3,772,634
Issued: Nov. 13, 1973
Appl. No.: 253,350
Filed: May 15, 1972

[52] U.S. Cl. ..... 339/65; 339/75 MP; 339/176 MP

[51] Int. Cl.[2] ..... H01R 13/62

[58] Field of Search ..... 339/17, 65, 66, 75, 339/125, 126, 176; 317/101

[56] References Cited

UNITED STATES PATENTS

| | | | |
|---|---|---|---|
| 2,994,056 | 7/1961 | Fox | 339/65 |
| 3,008,113 | 11/1961 | Johnson | 339/65 |
| 3,193,791 | 7/1965 | Bock et al. | 339/65 |
| 3,451,034 | 6/1969 | Beale | 339/75 MP |
| 3,487,350 | 12/1969 | Hammell | 339/17 C |
| 3,636,503 | 1/1972 | Bernutz et al. | 339/17 LC |
| 3,663,925 | 5/1972 | Proctor | 339/65 |
| 3,775,643 | 11/1973 | Schachnow et al. | 339/65 |

OTHER PUBLICATIONS

IBM Bulletin, Ecker et al., Latch, 4–1968, Vol. 10, No. 11, p. 1652.

*Primary Examiner*—Joseph H. McGlynn
*Attorney, Agent, or Firm*—Robert A. Green; Kenneth L. Miller

[57] ABSTRACT

The bracket includes an elongated base member having a series of first apertures for receiving (1) metallic connectors for making electrical contact with the electrodes of a display panel, and for receiving (2) a pair of alignment members for properly aligning the panel when it is coupled to the bracket. The elongated base member also includes an array of second apertures which are adapted to receive a plurality of vertical support members which are constructed so that they can be secured to a printed circuit board or the like. The vertical members can also be provided with movable arms for engaging and holding the display panel. The base member and the upright members are designed so that two base members can be connected together in series, and they can be held together mechanically by an upright member which engages both base members simultaneously.

21 Claims, 18 Drawing Figures

Fig. 1
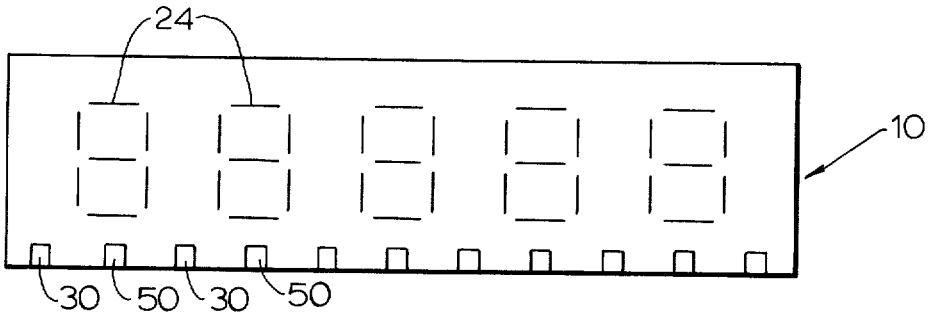
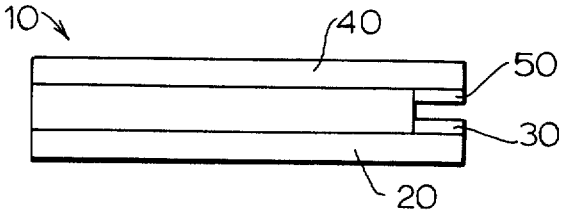
Fig. 2
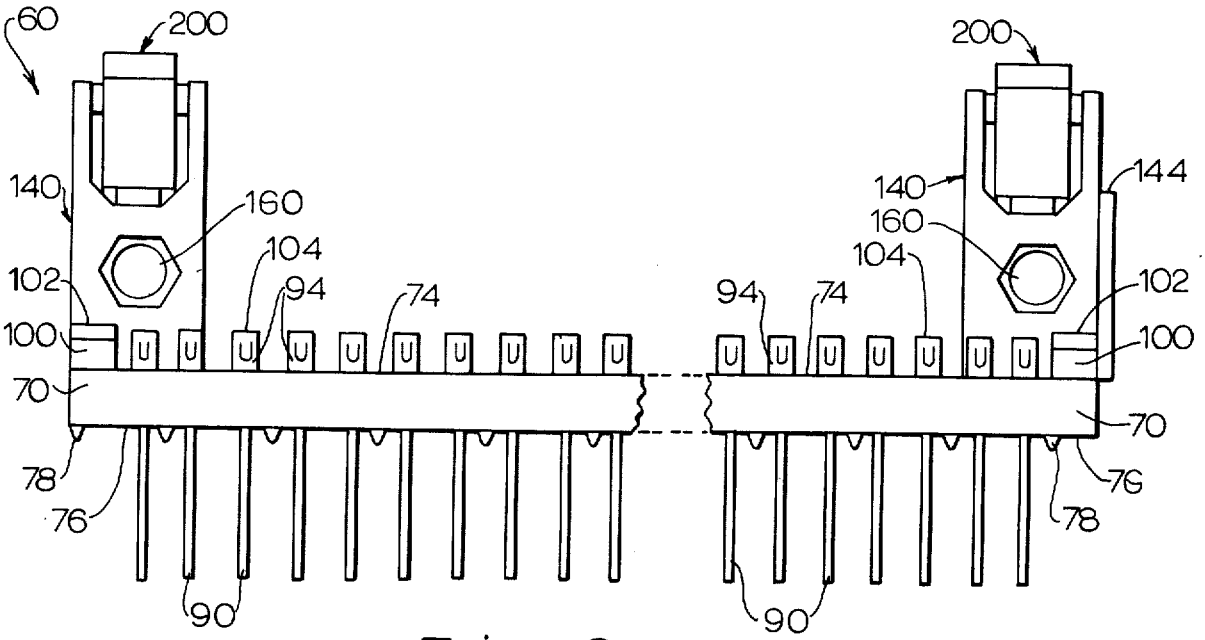
Fig. 3

Fig. 4
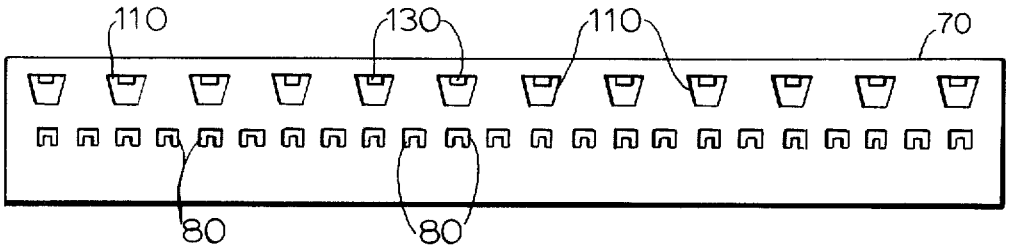
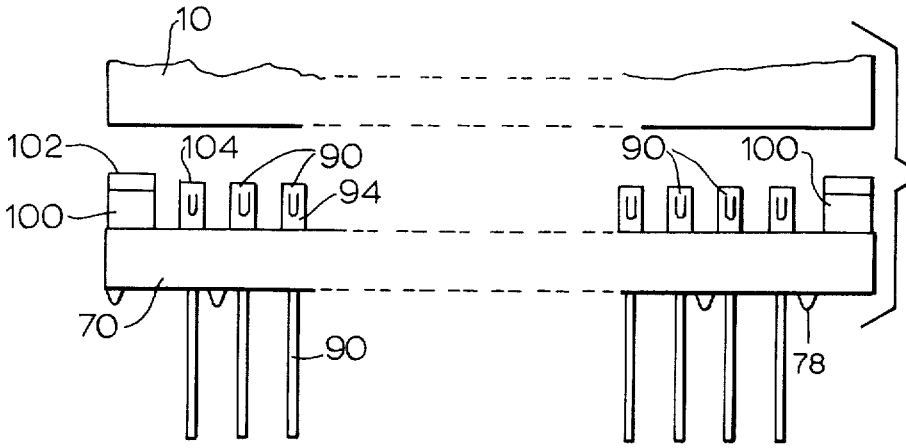
Fig. 5
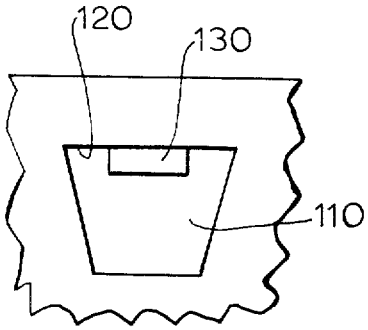
Fig. 6
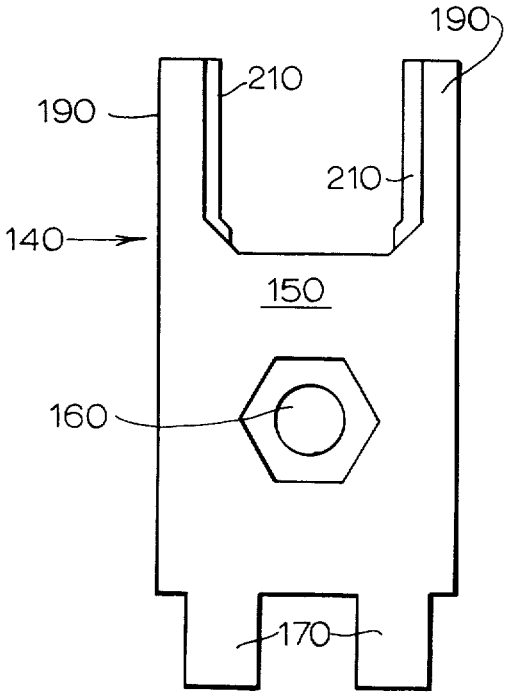
Fig. 7

Fig. 8
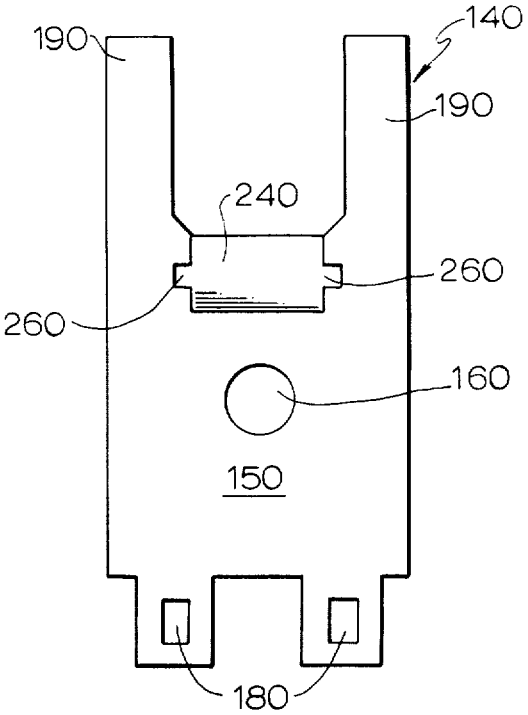
Fig. 9
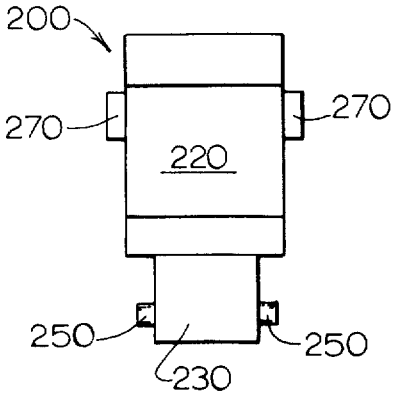
Fig. 10
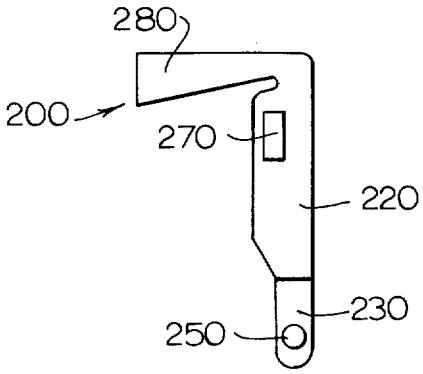
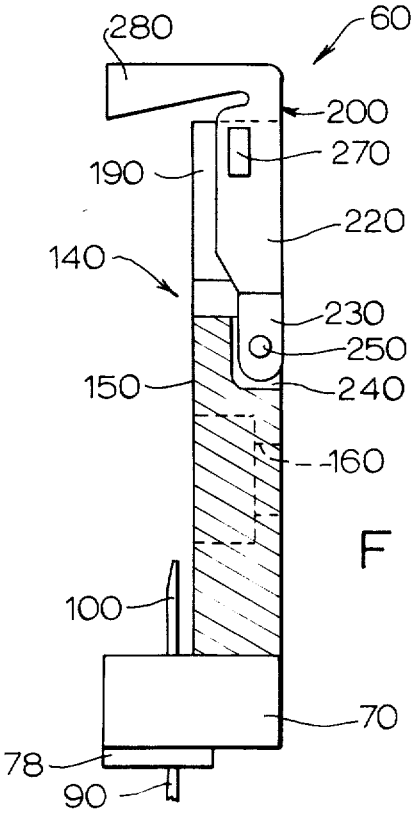
Fig. 11

Fig. 12
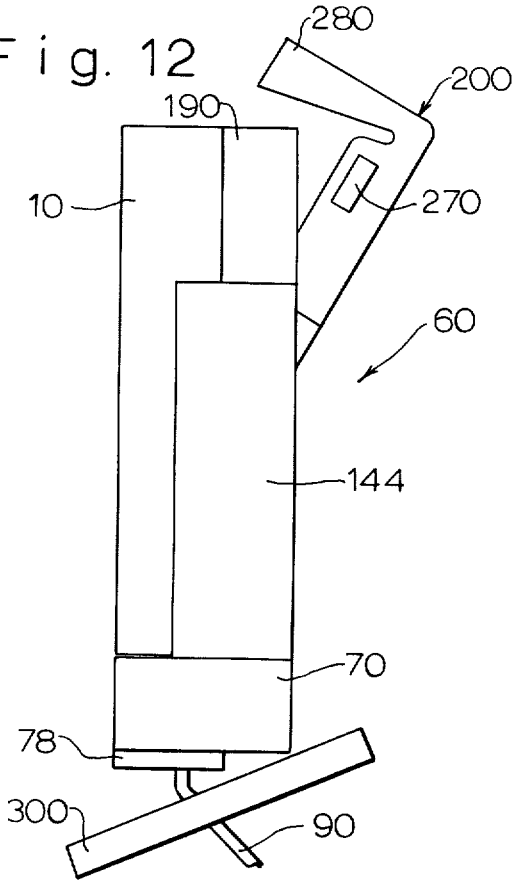
Fig. 13
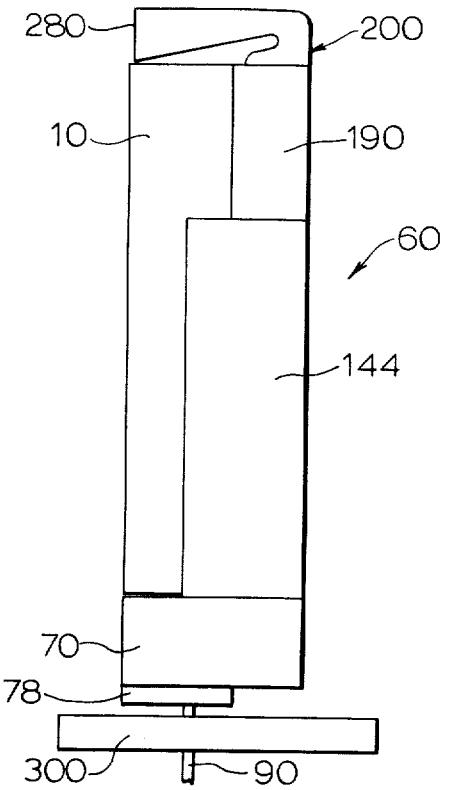
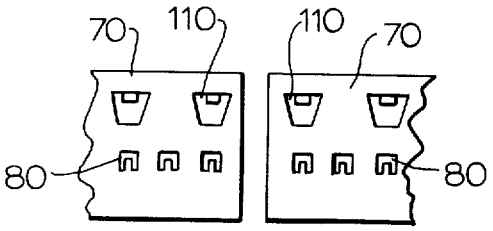
Fig. 14
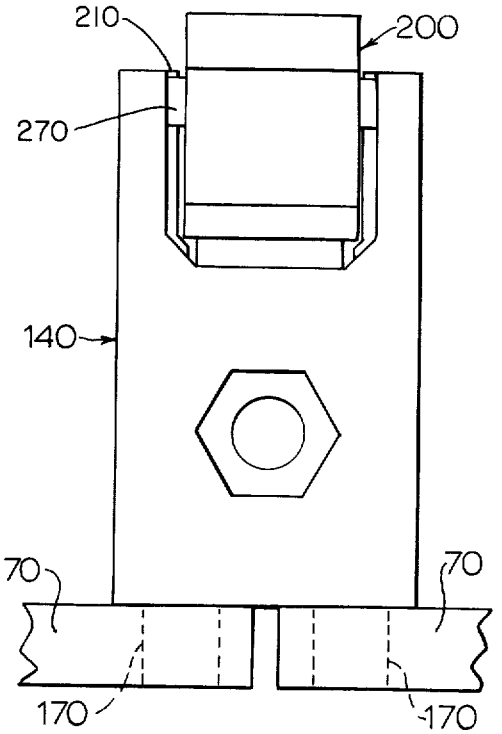
Fig. 15

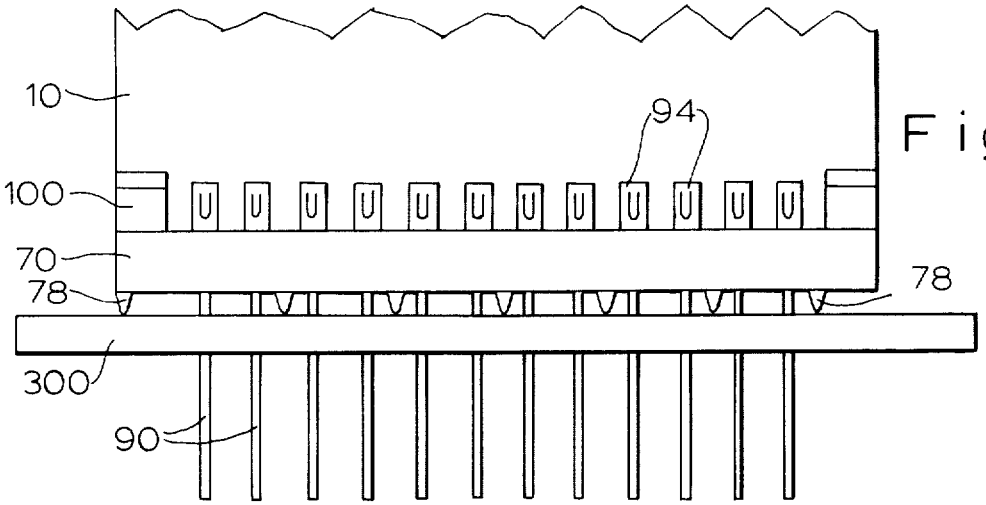
Fig. 16
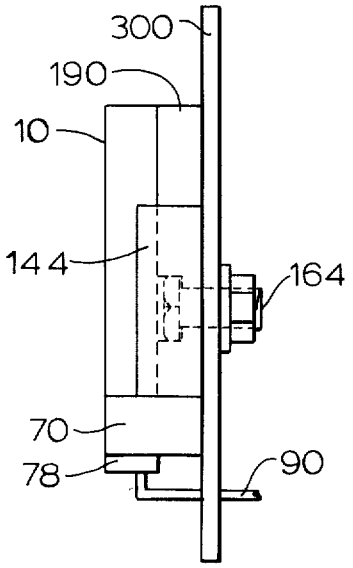
Fig. 17
Fig. 18
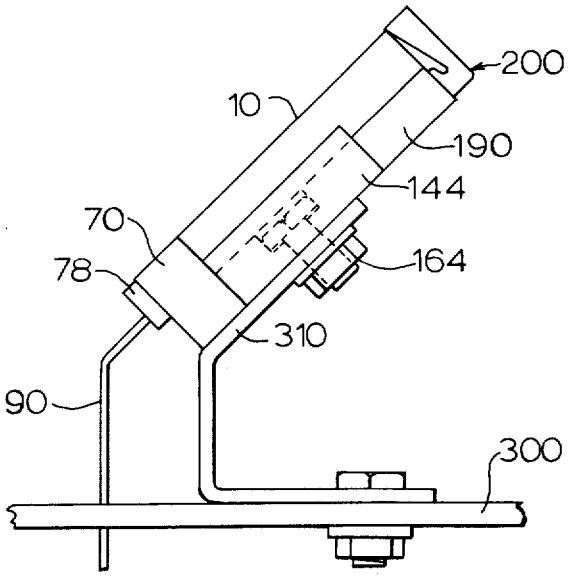

MOUNTING BRACKET FOR DISPLAY PANEL

Matter enclosed in heavy brackets [ ] appears in the original patent but forms no part of this reissue specification; matter printed in italics indicates the additions made by reissue.

BACKGROUND OF THE INVENTION

Through the years, electronic instruments providing numerical readout have progressed from using a plurality of individual numerical readout tubes to using display panels, each of which can itself display a plurality of numerals side by side. Display panels are relatively thin and flat, and they present novel problems which concern the means for providing electrical contact to the various electrodes, means for mounting the panel and its contacts on printed circuit boards or the like, and means for providing mechanical support for the panel itself.

SUMMARY OF THE INVENTION

Briefly, a mounting bracket for a display panel, according to the invention, includes a base member which carries a series of electrical contact elements which are adapted to engage the electrodes of a display panel and removably adjustable securing members which are mechanically secured to the base member and which mechanically grip the panel and secure it to the bracket.

DESCRIPTION OF THE DRAWINGS

FIG. 1 is a schematic plan view of a display panel used with the bracket of the invention;

FIG. 2 is an end elevational view of the panel of FIG. 1;

FIG. 3 is a front elevational view of a bracket embodying the invention;

FIG. 4 is a plan view of a portion of the bracket of FIG. 3;

FIG. 5 is a front elevational view of a portion of the bracket of FIG. 3 and a portion of a display panel to be mounted thereon;

FIG. 6 is an enlarged plan view of a portion of the apparatus shown in FIG. 4;

FIG. 7 is an enlarged front elevational view of a portion of the bracket of FIG. 3;

FIG. 8 is a rear elevational view of the bracket portion shown in FIG. 7;

FIG. 9 is a front elevational view of a member used with the bracket portion shown in FIG. 8;

FIG. 10 is a side elevational view of the member of FIG. 9;

FIG. 11 is a side view of a portion of the bracket of FIG. 3;

FIG. 12 is a side elevational view of a bracket embodying the invention carrying a display panel and illustrating one step in the method of coupling the bracket with a panel and one method of coupling the bracket to a substrate;

FIG. 13 is a side elevational view of the apparatus of FIG. 12 showing the bracket and display panel completely assembled and illustrating another arrangement for coupling the bracket to a substrate;

FIGS. 14 and 15 illustrate a special arrangement for using the bracket of the invention;

FIG. 16 is a front elevational view illustrating sti another arrangement for using the bracket of the inver tion with a display panel and a substrate; and FIGS. 17 and 18 are side elevational views illustratin other arrangements for coupling the bracket of th invention with display panels and mounting them o substrates.

DESCRIPTION OF THE PREFERRED EMBODIMENTS

Mounting brackets embodying the invention are par ticularly adapted for use with display panels of the typ illustrated schematically as panel 10 in FIGS. 1 and 2 No attempt is made to illustrate the features of th panel with exactness, and not all of the element thereof are shown or described. Panel 10 is a thin, flat gas-filled device and includes a base plate 20 whicl carries a plurality of groups of cathode electrodes 2 and contact elements or pads 30 to which the elec trodes 24 are connected by conductive runs (no shown). The panel includes a cover plate 40 spacec from the base plate but sealed to it. The cover plate carries anode electrodes (not shown) on its inner surface, one anode being provided for each group of electrodes 24. Each anode is electrically connected to a pad 50, the pads 50 being formed along the edge of the cover plate. Not all of the electrodes or contact elements are shown, to simplify the drawing. The contact elements 30 and 50 are all disposed along the adjacent lower edges of the base plate and cover plate, respectively as shown, and connectors are inserted between the plates to make the desired electrical connection to the cathodes 24 and anodes (not shown). This panel and connectors therefor are described in detail and claimed in copending application Ser. No. 201,655, filed Nov. 24, 1971.

A mounting bracket 60 embodying the invention, referring to FIGS. 3 to 5, includes an elongated base member 70 which is normally oriented horizontally, is generally rectangular in cross-section, and has a top surface 74 and a bottom surface 76 (FIG. 3). The base member is provided with a series of elevating pads 78 along its bottom surface for elevating the base member above the surface of a support member, such as a printed circuit board, on which the base member may be mounted. The small space thus provided between the base member and a support surface is sufficient to permit cleaning operations to be performed, such as the removal of flux after a soldering operation. The base member 70 includes a series of apertures 80 (FIG. 4) oriented generally along its central axis and extending from the top surface 74 of the base member through to the bottom surface 76. The apertures 80 are adapted to receive and lock in place metallic electrical connectors 90 which includes portions 94 which are inserted between panel plates 20 and 40 to make contact with contact pads 30 and 50.

The apertures 80 and connectors 90 are designed and shaped so that portions of the apertures engage portions of the connectors which are locked in place thereby. Such arrangements are well known in the art and need not be described in detail. The apertures 80 are particularly adapted to receive connectors of the type shown in the above-mentioned copending application. The connectors 90 are provided in each of the apertures 80 except in the first and the last which themselves receive relatively rigid members 100.

The members 100 are preferably small metal plates ich are adapted to be locked into apertures 80. The :mbers 100 are also dimensioned so that their upper ge 102 rise above the upper edges 104 of the connec- 's 90 so that, when a display panel 10 and a bracket are brought together (FIG. 5) and the base member approaches the panel so that the connectors 90 can inserted between panel plates 20 and 40, the mem- rs 100 enter the space between the panel plates first d then guide the connectors smoothly into place. ıis prevents the connectors from striking one of the ıtes 20 and 40, and perhaps being damaged.

The elongated base member 70 also includes a series apertures 110 (FIGS. 4 and 6) aligned parallel to the ries of apertures 80 but closer to its rear wall. The ertures 110 are spaced apart uniformly, and they .ve a generally trapezoidal cross-section. The rear ıll 120 of each aperture is provided with an elevation protrusion 130 which is adapted to provide a locking nction with an upright member 140 (to be described) ıich is secured to member 70 and extends vertically erefrom.

The upright member 140, used with the elongated ıse member 70 (FIGS. 3 and 7 to 11), is generally ctangular and plate-like and has a main body portion 50 provided with a hole 160 which is adapted to re- :ive a screw or bolt 164 or the like (FIGS. 17 and 18), / means of which the upright member 140 and the :acket 60 to which it is secured can be bolted to a rinted circuit board or the like. The member 140 ıcludes a pair of legs 170 which project from the lower ɔrtion of the main body and are of generally trapezoi- al cross-section. The legs are thus adapted to be in- :rted into two adjacent aperture 110 in the member 0, and they include in their rear walls depressions 180 'hich receive the projections 130 in the apertures 110. 'he trapezoidal shapes of the legs and the apertures 10, and the combination of projections 130 and de- ressions 180, provide optimum locking action be- ween an upright member 140 and base member 70.

In addition, a pair of arms 190 project upwardly from he upper margin of the main body portions 150 for eceiving a pivotable L-shaped bracket 200 (FIGS. 9 nd 10). A narrow lip 210 (FIG. 7) projects laterally rom the inner rear edge of each arm 190 to permit ıracket 200 to bear against it in a manner to be de- cribed. The bracket 200 is generally L-shaped and ncludes a first vertical portion 220, adapted to be ɔositioned between the arms 190 of member 140, vhich includes a lower portion 230 which is adapted to ɔe seated in a recess 240 in the rear wall of the member 140 (FIG. 8). The lower portion 230 of member 200 :arries lateral pin-like projections 250 which enter ıuitably shaped lateral recesses 260 in recess 240. Member 200 is thus pivotable on the pin-like projec- :ions 250 with respect to member 140. The side walls of member 200 carry projecting tabs 270 which bear ıgainst lips 210 on legs 190 of member 140. The L- shaped member 200 also includes a horizontal arm 280 which extends generally perpendicularly from the upper end of vertical portion 220, and the joint be- tween the arm 280 and vertical member 220 is shaped and designed so that the two are flexibly connected to each other for a purpose to be described.

The L-shaped bracket 200 is coupled to upright member 140 by having the lower portion 230 locked into recess 240, and then the bracket is pivoted so that is passes between and through arms 190, and then it can fall back so that tabs 270 on member 220 bear against lips 210 on arm 190. The bracket 200 can be removed by reversing the foregoing steps.

In operation of the bracket of the invention 60, the connectors 90 and two or more alignment members 100 are secured in place on base member 70, and at least two upright members 140 are inserted in apertures 110, preferably at the opposite ends of the base member 70 (FIG. 3). Generally, the member 70 is of approximately the same length as the panel 10 which it is to support. The movable L-shaped brackets 200 carried by upright members 140 are pivoted rearwardly away from the panel (FIG. 12), and the panel is mounted in place with the connectors 90 positioned between the top and base plates 20 and 40 and engaging contacts 30 and 50, and then the pivotal members 200 are snapped into position, with the flexible arms 280 engaging the upper edge of the panel to hold it securely in place (FIG. 13). Because of the flexibility of arms 280, they can adapt to, and can be used with, panels of a relatively wide range of heights.

It is noted that at least one upright member 140, in this case, the one on the right as seen in FIG. 3, is provided with a vertical lip or guide wall 144 at the outer edge of the main body portion and extending along its length (FIGS. 3, 12 and 13). The guide wall 144 is used to guide the panel 10 into place, and, in coupling a panel to a bracket 60, the edge of the panel is pressed against wall 144 as the connectors 90 and plates 100 are inserted therein, as described above with respect to FIG. 5.

The various members 70 and 140, and apertures 110, are designed so that, in a modification of the invention (FIGS. 14 and 15), to accommodate a relatively long panel 10 (not shown) when a correspondingly long base member 70 is not available, two short members 70 can be positioned in axial alignment and positioned so that the adjacent end apertures 110 are suitably spaced apart to receive the legs 170 of one of the vertical members 140. The vertical member 140 thus provides coupling between the two individual first members 70.

The bracket of the invention can be used in many different ways. For example, in the simplest arrangement illustrated in FIG. 16, only base member 70, carrying connectors 90 and alignment plates 100, is used for supporting panel 10. Generally, in this combination, the base member 70 is mounted directly on a printed circuit board 300, with its connectors 90 suitably secured in place, for example, by soldering. In this type of use, the elevating pads 78 on the lower surface of base member 70 permit flux or the like to be cleaned off the board under the base member.

In another arrangement illustrated in FIG. 17, base member 70 and at least two upright members 140 are employed without L-shaped brackets 200. With this type of combination, the bracket 60 is secured to a printed circuit board 300 which is larger than the panel and extends above the upper edge of the panel so that, if brackets 200 had been provided, they would not be usable. With this type of arrangement, the connectors 90 are suitably bent and inserted in holes in the printed circuit board 300.

In still another arrangement shown in FIG. 18, the bracket 60 carrying its panel 10 is secured to one or more suitably shaped metallic brackets 310 which themselves are secured to a printed circuit board 300. As shown, the bracket 310 is shaped to position the panel at a desired viewing angle.

It is clear from the foregoing description and the illustrations, that, with the bracket of the invention and with contacts 90 of the proper length, a panel may be mounted at any desired angle and at any distance from a printed circuit board or other support member of substantially any size and shape.

It is also clear that modifications may be made within the scope of the invention. For example, more than two upright members 140 may be used to support a panel, and more than two guide members 100 may be used to guide a panel when coupled to a bracket.

What is claimed is:

[ 1. A mounting bracket for a thin, flat display panel having spaced-apart top and bottom plates which carry electrical contacts along adjacent aligned edges thereof, said bracket comprising an elongated insulating base member having a series of apertures formed along its length and having a top surface and a bottom surface, a flexible electrical connector secured in each of a plurality of said apertures and having first portions which project to substantially the same height above said top surface of said base member for insertion into said panel, and second portions which project beneath the lower surface of said base member for insertion into a printed circuit board or the like, and a rigid panel guide member inserted in at least two of said apertures, each said guide member extending above said connectors and positioned to engage said panel first, before said connectors engage said panel when a panel is brought into engagement with said base member, said connectors and said guide members being oriented along a common axis for insertion into the spaced between said top and bottom plates of said panel. ]

[ 2. The bracket defined in claim 1 and including a plurality of elevating means on the lower surface of said base member for spacing said base member from a support member when said bracket is secured to said support member. ]

[ 3. The bracket defined in claim 1 wherein said guide members are positioned at the ends of said series of apertures. ]

[ 4. The bracket defined in claim 1 and including at least one upright support member secured to said base member and adapted to support said display panel carried by said bracket. ]

[ 5. The bracket defined in claim 4 and including a pivotable clamping member pivotally coupled to said upright member and adapted to engage an edge of said panel. ]

[ 6. The bracket defined in claim 4 wherein said upright member includes a hole for receiving a bolt for securing said bracket to a support member. ]

[ 7. The bracket defined in claim 4 wherein said upright member includes a pair of spaced-apart arms, each of said arms having a support lip and a generally L-shaped member pivotably secured to said upright member and positioned between said arms and bearing against said lips. ]

[ 8. The bracket defined in claim 7 wherein said upright member includes a recess formed in its rear surface and receiving a portion of said L-shaped member which is pivotably secured thereto. ]

9. A mounting bracket for a thin, flat display panel having spaced-apart top and bottom plates which carry electrical contacts along adjacent aligned edges thereof, said bracket comprising an elongated base member having a series of apertures formed along its length, an electrical connector secured in each of a plurality of said apertures, a panel guide member inserted in at least two of said apertures, each said guide member extending above said connectors and positioned to engage said panel first and before said connectors engage said panel when a panel is coupled to said base member, said connectors and said guide members being oriented along a common axis for insertion into the space between said top and bottom plates of said panel, at least one upright support member secured to said base member and adapted to support said display panel carried by said bracket, and a pivotable clamping member pivotally coupled to said upright member and adapted to engage an edge of said panel.

10. The bracket defined in claim 9 and including a plurality of elevating means on the lower surface of said base member for spacing said base member from a support member when said bracket is secured to said support member.

11. The bracket defined in claim 9 wherein said guide members are positioned at the ends of said series of apertures.

12. The bracket defined in claim 9 wherein said upright member includes a hole for receiving a bolt for securing said bracket to a support member.

13. The bracket defined in claim 9 wherein said upright member includes a pair of spaced-apart arms, each of said arms having a support lip and a generally L-shaped member pivotably secured to said upright member and positioned between said arms and bearing against said lips.

14. The bracket defined in claim 13 wherein said upright member includes a recess formed in its rear surface and receiving a portion of said L-shaped member which is pivotably secured thereto.

15. A mounting bracket for a thin, flat display panel having spaced-part top and bottom plates which carry electrical contacts along adjacent aligned edges thereof, said bracket comprising an elongated base member having a series of first apertures formed along its length, an electrical connector secured in each of a plurality of said apertures, a panel guide member inserted in at least two of said apertures, each said guide member extending above said connectors and positioned to engage said panel first and before said connectors engage said panel when a panel is coupled to said base member, said connectors and said guide members thus being oriented along a common axis for insertion into the space between said top and bottom plates of said panel, a series of second apertures formed along the length of said base member, at least one upright member secured to said base member and having legs inserted in selected ones of said second apertures, and a pivotable clamping member pivotally coupled to said upright member and adapted to engage an edge of said panel.

16. The bracket defined in claim 15 wherein said upright member includes a hole for receiving a bolt for securing said bracket to a support member.

17. The bracket defined in claim 15 wherein said upright member includes a pair of spaced-apart arms, each of said arms having a support lip and a generally L-shaped member pivotably secured to said upright member and positioned between said arms and bearing against said lips.

18. The bracket defined in claim 17 wherein said upright member includes a recess formed in its rear surface and receiving a portion of said L-shaped member which is pivotably secured thereto.

19. A mounting bracket for a thin, flat display panel having spaced-apart top and bottom plates which carry electrical contacts along adjacent aligned edges thereof, said bracket comprising an elongated insulating base member having a series of first apertures formed along its length and having a top surface and a bottom surface, a flexible electrical connector secured in each of a plurality of said first apertures and having first portions which project to substantially the same height above said top surface of said base member for insertion into said panel, and second portions which project beneath the lower surface of said base member for insertion into a printed circuit board or the like, a rigid panel guide member inserted in at least two of said apertures, each said guide member extending above said connectors and positioned to engage said panel first, before said connectors engage said panel when a panel is coupled to said base member, said connectors and said guide members being oriented along a common axis for insertion into the space between said top and bottom plates of said panel, a series of second apertures formed along the length of said base member, and at least one upright member secured to said base member and having legs inserted in selected ones of said second apertures, said panel having its bottom plate bearing against said upright member whereby mechanical support is provided therefor.

20. The bracket defined in claim 19 and including two of said upright support members spaced apart and clamping said panel in place.

21. The bracket defined in claim 19 and including a pivotable clamping member pivotally coupled to said upright member and adapted to engage an edge of said panel.

22. The bracket defined in claim 21 wherein said upright member includes a hole for receiving a bolt for securing said bracket to a support member.

23. The bracket defined in claim 19 wherein said upright member includes a pair of spaced-apart arms, each of said arms having a support lip and a generally L-shaped member pivotably secured to said upright member and positioned between said arms and bearing against said lips.

24. The bracket defined in claim 23 wherein said upright member includes a recess formed in its rear surface and receiving a portion of said L-shaped member which is pivotably secured thereto.

25. A mounting bracket for a thin, flat display panel having spaced-apart top and bottom plates which carry electrical contacts along adjacent aligned edges thereof, said bracket comprising a pair of elongated base members, each having a series of first apertures and a series of second apertures formed along its length, said base members being disposed end to end, with the series of first apertures being aligned and the series of second apertures being aligned, an electrical connector secured in each of a plurality of said first apertures, a panel guide member inserted in at least one of said first apertures, said guide members extending above said connectors, and an upright member having a pair of legs coupled to said pair of elongated base members, with one leg engaging a second aperture in one member and the other leg engaging a second aperture in the other member.

*26. A mounting bracket for a thin, flat display panel having spaced-apart top and bottom plates which carry electrical contacts along adjacent aligned edges thereof, said bracket comprising*

*an elongated insulating base member having a series of apertures formed along its length and having a top surface and a bottom surface,*

*a flexible electrical connector secured to each of a plurality of said apertures and having first portions which project to substantially the same height above said top surface of said base member for insertion into said panel, and second portions which project beneath the lower surface of said base member for insertion into a printed circuit board of the like,*

*a rigid panel guide member inserted in at least two of said apertures, each said guide member extending above said connectors and positioned to engage said panel first, before said connectors engage said panel when a panel is brought into engagement with said base member,*

*said connectors and said guide members being oriented along a common axis for insertion into the space between said top and bottom plates of said panel,*

*at least one upright support member secured to said base member transverse to said axis whereby the bottom plate of said panel can rest on and be supported by said support member when said display panel is carried by said bracket, and*

*a pivotable clamping member pivotally coupled to said upright member and adapted to engage and clamp to an edge of said panel.*

*27. A mounting bracket for a thin, flat display panel having spaced apart top and bottom plates which carry electrical contacts along adjacent aligned edges thereof, said bracket comprising*

*an elongated insulating base member having a series of apertures formed along its length and having a top surface and a bottom surface,*

*a flexible electrical connector secured in each of a plurality of said apertures and having first portions which project to substantially the same height above said top surface of said base member for insertion into said panel, and second portions which project beneath the lower surface of said base member for insertion into a printed circuit board or the like,*

*a rigid panel guide member inserted in at least two of said apertures, each said guide member extending above said connectors and positioned to engage said panel first, before said connectors engage said panel*

*when a panel is brought into engagement with said base member,*

*said connectors and said guide member being oriented along a common axis for insertion into the space between said top and bottom plates of said panel, and*

*an upright member secured to said base member and extending upwardly from said top surface thereof, said upright member includes a pair of spaced-apart arms, each of said arms having a support lip and a generally L-shaped member pivotably secured to said upright member and positioned between said arms and bearing against said lips.*

*28. A mounting bracket for a thin, flat display panel having spaced-apart top and bottom plates which carry electrical contacts along adjacent aligned edges thereof, said bracket comprising an elongated insulating base member having a series of apertures*

*formed along its length and having a top surface and a bottom surface,*

*a flexible electrical connector secured in each of a plurality of said apertures and having first portions with project to substantially the same height above said top surface of said base member for insertion into said panel, and second portions which project beneath the lower surface of said base member for insertion into a printed circuit board of the like,*

*a rigid panel guide member inserted in at least two of said apertures, each said guide member extending above said connectors and positioned to engage said panel first, before said connectors engage said panel when a panel is brought into engagement with said base member,*

*said connectors and said guide members being oriented along a common axis for insertion into the space between said top and bottom plates of said panel,*

*at least one upright support member secured to said base member transverse to said axis whereby the bottom plate of said panel can rest on and be supported by said support member when said display panel is carried by said bracket, and said uprigl member includes a hole for receiving a bolt for secu ing said bracket to a support member, and*

*a pivotable clamping member pivotally coupled t said upright member and adapted to engage an clamp to an edge of said panel.*

*29. A mounting bracket for a thin, flat display pan having spaced apart top and bottom plates which carr electrical contacts along adjacent aligned edges thereo said bracket comprising*

*an elongated insulating base member having a series c apertures formed along its length and having a to surface and a bottom surface,*

*a flexible electrical connector secured in each of plurality of said apertures and having first portion which project to substantially the same height abov said top surface of said base member for insertio into said panel, and second portions which projec beneath the lower surface of said base member fc insertion into a printed circuit board of the like,*

*a rigid panel guide member inserted in at least two c said apertures, each said guide member extendin above said connectors and positioned to engage sai panel first, before said connectors engage said pan when a panel is brought into engagement with sai base member,*

*said connectors and said guide members being ori ented along a common axis for insertion into th space between said top and bottom plates of sai panel, and*

*said upright member includes a pair of spacea apart arms, each of said arms having a suppor lip and generally L-shaped member pivotabl secured to said upright member and positione between said arms and bearing against said lips and said upright member includes a reces formed in its rear surface and receiving a portio of said L-shaped member which is pivotabl secured thereto.*

* * * * *